United States Patent
Poechmueller

[19]

[11] Patent Number: 5,889,420
[45] Date of Patent: Mar. 30, 1999

[54] OCD WITH LOW OUTPUT CAPACITANCE

[75] Inventor: Peter Poechmueller, Burlington, Vt.

[73] Assignee: Siemens Aktiengesellschaft, Munich, Germany

[21] Appl. No.: 885,329

[22] Filed: Jun. 30, 1997

[51] Int. Cl.[6] .............................................. H03K 19/0185
[52] U.S. Cl. .............................. 327/108; 326/81; 327/333
[58] Field of Search ..................................... 327/108, 112, 327/333, 427, 434, 437; 326/81, 82, 83, 86, 87, 17, 27

[56] References Cited

U.S. PATENT DOCUMENTS

| 5,418,477 | 5/1995 | Dhong et al. | 326/71 |
| 5,635,861 | 6/1997 | Chan et al. | 326/81 |
| 5,682,116 | 10/1997 | Dreibelbis et al. | 327/333 |
| 5,726,589 | 3/1998 | Cahill et al. | 326/81 |

*Primary Examiner*—My-Trang Nu Ton
*Attorney, Agent, or Firm*—Stanton C. Braden

[57] ABSTRACT

An OCD circuit with stacked transistor that is gated to switch on prior to the switching on of the transistors which the stacked transistor protects. The gating of the stacked transistor results in the reduction of the total OCD output capacitance.

20 Claims, 2 Drawing Sheets

5,889,420

OCD WITH LOW OUTPUT CAPACITANCE

FIELD OF THE INVENTION

The invention relates to a support circuitry for integrated circuits and, more particularly, to an off-chip driver circuit with reduced output capacitance.

BACKGROUND OF THE INVENTION

In the design of integrated circuits (ICs), such as memory chips, off chip drivers (OCDs) are employed to transfer data information from the memory chip to the external environment. The OCD generally comprises a plurality of transistors, including n-type field effect transistors (n-FETs) and p-type FETs (p-FETs) configured to drive a chip's internal data signal as fast as possible to the outside system environment, which represents a heavy load ($\approx 100$ pF).

To improve noise characteristics, such as reducing ringing caused by leadframe inductance, the OCD is usually provided with multiple stages. For example, in a two stage OCD, the output of the second stage can be delayed by a predetermined delay with respect to the output at the first stage.

Continuous demand for the miniaturization of devices has resulted in smaller and smaller feature sizes. For example, the gate lengths of current n-FETs are about 0.25 microns ($\mu$m). Such lengths are, however, susceptible to hot carrier degradation. This occurs in the presence of high drain-source voltages during switching of the gate (worst case condition: gate voltage=½ drain-source voltage).

To reduce or prevent hot carrier degradation as a result of high source-drain voltages, a first n-FET transistor is stacked or placed in series with a second n-FET. The gate of the first or stacked n-FET is coupled to $V_{DD}$, thus providing a voltage drop of $V_t$ (where $V_t$ is the gate threshold of the stack n-FET). Due to the body effect, this voltage drop is actually even greater. The voltage drop provided by the stack n-FET lowers the source-drain voltage of the second n-FET sufficiently during switching to reduce or prevent hot carrier degradation.

Although the stacking configuration effectively reduces hot carrier degradation, it however results in relatively high output capacitance. This is because stacking of the transistors doubles effective gate length, which for performance reasons requires a widening of the transistors. Such increase in output capacitance can exceed specified limits. For example, a conventional OCD without the stacked configuration has a typical output capacitance of about 4.5–5 pF. When incorporating a stacked configuration, the total capacitance approaches or exceeds the maximum allowed specified value, which is about 7 pF. This is because stacking effectively doubles the transistor length, which requires doubling of width to achieve the same performance.

Thus, it is desirable to provide an OCD with low output capacitance without the need to sacrifice performance.

SUMMARY OF THE INVENTION

The invention relates to integrated circuits and, in particular, to an off chip driver. In accordance with one embodiment of the invention, the off chip driver includes at least a first stage with first and second transistors having a first input coupled to a gate of the first transistor and a second input coupled to a gate of the second transistor. A stacked transistor is provided to reduce hot carrier degradation during switching of the second transistor. The stacked transistor is coupled in series with the second transistor. A control signal is provided to switch on the stacked transistor before the second transistor is switched on, thus reducing the output capacitance of the off chip driver.

In accordance with another embodiment of the invention, a bleeder circuit is used to provide a node between the stacked transistor and second transistor with a voltage level to reduce the stacked transistor's source-drain voltage during switching below that which causes hot carrier degradation.

DESCRIPTION OF THE INVENTION

The invention relates to high performance OCDs with low output capacitance. In one embodiment, low output capacitance is achieved without sacrificing OCD performance. The OCD, for example, is implemented in a memory chip including random access memory (RAM) such as dynamic RAM (DRAM), static RAM (SRAM), and synchronous DRAM (SDRAM). Other ICs that employ OCDs include CMOS application specific ICs (ASICs) or logic devices. To facilitate understanding of the invention, a description of a conventional OCD is provided.

Figure 1:
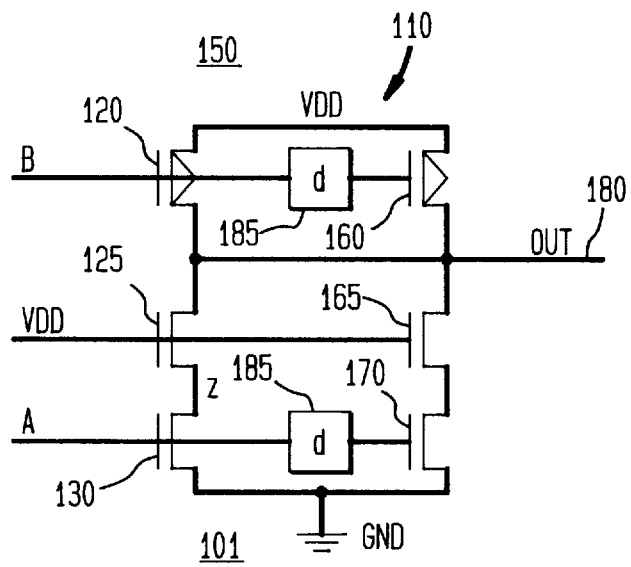
FIG. 1 shows a schematic diagram of a conventional OCD with stacked protection.

Referring to FIG. 1, a conventional OCD 101 such as one employed in a memory chip is shown. Illustratively, the OCD includes first and second stages 110 and 150. The first stage comprises a p-FET 120 whose drain is coupled in series with n-FETs 125 and 130. The source of p-FET 120 is coupled to an operating voltage ($V_{DD}$) and the source of n-FET 130 is coupled to ground (GND). The gate of the p-FET 120 responds to an input signal B and the gate of n-FET 130 responds to an input signal A. The n-FET 125 is the stacked n-FET whose gate is coupled to, for example, $V_{DD}$. Typically, for state of the art memory devices, $V_{DD}$ is about 3.3 volts (V) and gate threshold voltage ($V_t$) is about 0.7 V. As such, the n-FET transistor is always switched on with current flowing through it, causing a voltage drop of about $V_t$ across the transistor. Due to body effect, the drop in voltage is greater than $V_t$. This results in node z to have a voltage of less than $V_{DD}-V_t$ or 2.3 V. Reducing the voltage from 3.3 V to less than 2.3 V is sufficient to avoid hot carrier degradation to transistor 130.

The second stage, which is similar to the first stage, comprises p-FET 160 coupled in series with n-FET 165 and 170. The source of p-FET 160 is commonly coupled to $V_{DD}$ with the source of p-FET 130 of the first stage. The source of the n-FET 170 is commonly coupled to GND with the source of n-FET 130. The outputs of the first and second stages are commonly coupled to provide output 180 of the OCD. The gate of n-FET 165 is coupled to $V_{DD}$, switching on the transistor to cause a drop of $V_t$ across it. As a result, the drain-source voltage of n-FET 170 is lowered by $V_t$ to prevent or reduce hot carrier degradation.

Inputs A and B are also coupled to the gate of transistors 170 and 160, respectively. However, the inputs are delayed by delay circuits 185, delaying the output of the second stage by d. The delay reduces output current change (dI/dt) of the OCD, thereby improving noise characteristics.

The output of the OCD depends on the values of inputs at terminal A and B. For example, the output equals to about $V_{DD}$ when A and B are low. Output of the OCD is equal to about GND when both A and B are high. If input A is low and B is high, output is tristated (i.e., disconnected from both $V_{DD}$ and GND).

Typically, high performance demands are placed on OCDs. For example, OCDs are required to produce high output currents in order to drive relatively high output loads ($\approx$100 pF) within specified timing constraints. To achieve such performance requirements, devices of sufficient width which result in lower resistance and higher currents are used. Another requirement of OCDs is to maintain output capacitance to within certain specified limits. The output capacitance is affected by the width of the devices. Specifically, the wider the device, the higher the capacitance. The two design parameters (performance versus lower output capacitance) can pose potential conflicts in the design of OCDs. For example, stacking of n-FETs that result in improving reliability of devices by reducing hot carrier degradation effectively doubles the gate length of the device. This in turn requires wider devices to lower the output resistance in order to achieve the same performance. Wider devices increase output capacitance.

Also, the gate capacitance of the stacked n-FET, which is always on, adds to the OCD's output capacitance. As previously discussed, this total OCD output capacitance, in some instances, exceeds or approaches specified limits, adversely affecting performance.

In accordance with the invention, an OCD with reduced output capacitance is provided. The reduced output capacitance is achieved without sacrificing speed or protection from hot carrier degradation. The invention achieves reduced output capacitance by clocking the stacked n-FETs.

Figure 2:
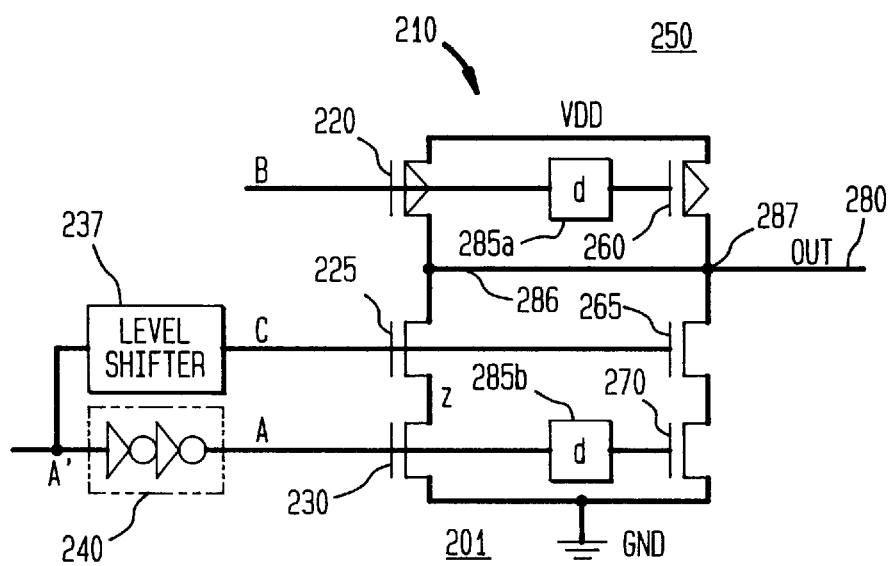
FIG. 2 shows an embodiment of the present invention.

FIG. 2 is an illustrative embodiment of an OCD 201. As shown, the OCD 201 comprises first and second stages 210 and 250 connected in parallel. The first stage comprises transistors 220, 225, and 230 configured in series. Similarly, the second stage comprises transistors 260, 265, and 270 configured in series. The transistors 220 and 260 have their sources commonly coupled to $V_{DD}$ which, for example, is about 3.3 volts. The sources of the transistors 230 and 270 are connected to GND. Transistors 225 and 265 are stacked to provide device degradation protection for transistors 230 and 270. The first and second stage outputs 286 and 287, respectively, are coupled together to form an output 280 of the OCD. Illustratively, transistors 220 and 260 are p-FETs and transistors 225, 230, 265, and 270 are n-FETs.

Inputs A and B which, for example, are data control signals in a memory chip, are provided to the OCD. Input B is connected to the gates of transistors 220 and 260, while input A is connected to the gates of transistors 230 and 270. Delay circuits 285a and 285b provide a delay for input signals to the second stage with respect to the first stage, thus delaying the output of the OCD with respect to inputs A and B. The delay d is sufficiently long to reduce or eliminate ringing caused by transistors switching as a result of noise due to high dI/dt in connection with leadframe inductance.

The gates of the stacked transistors 225 and 265 are gated by a control signal C. The stacked transistors, which protect the n-FETs 230 and 270 from hot carrier degradation, are switched on by control signal C prior to the switching on of n-FETs 230 and 270. In one embodiment, the control signal C is the same signal that controls transistors 230 and 270. As shown, input signal A is used to control both the stacked transistors and n-FETs 230 and 270. Optionally, a level shifter 237 is provided to overdrive the stacked transistors to reduce their negative impact on OCD performance by reducing their resistance. In one embodiment, the level shifter is employed to activate the OCD gate at a level equal to about $V_{DD}$.

To ensure that the stacked transistors are switched on prior to n-FETs 230 and 270, a delay circuit 240 is provided to delay signal A to transistor 230. In one embodiment, the delay circuit 240 comprises two inverters coupled in series. Such a delay circuit is sufficient to ensure that transistor 230 is switched on after the stacked transistor 225. Other delay circuits such as a buffer or series of buffers or additional inverters with delay capacitors are also useful. It is noted, however, that the delay circuit 240 creates a delay in the output of the OCD, affecting its performance.

In an alternative embodiment, the stacked transistor of the second or output stage is gated by a control signal C. The control signal, for example, is the same signal as the one that switches on n-FET transistors 230 and 270. The stacked transistor of the first stage is always switched on by being connected to, for example, $V_{DD}$. Since the second stage transistor 270 is delayed by delayed circuit d, additional delay circuit is not needed to ensure that the stacked transistor is switched on prior to transistor 270. The gating of the output stacked capacitor causes no delay in operation of the OCD. A reduction in output capacitance is still achieved even when only the output stacked transistor is gated.

By gating the stacked transistor to switch on prior to the n-FET that it protects, the stacked gate capacitance of the stack transistor and additional diffusion capacitances are not effective on the output of the OCD, thereby reducing the OCD's total output capacitance. As a result, a reliable OCD with good performance characteristics is provided.

Figure 3:
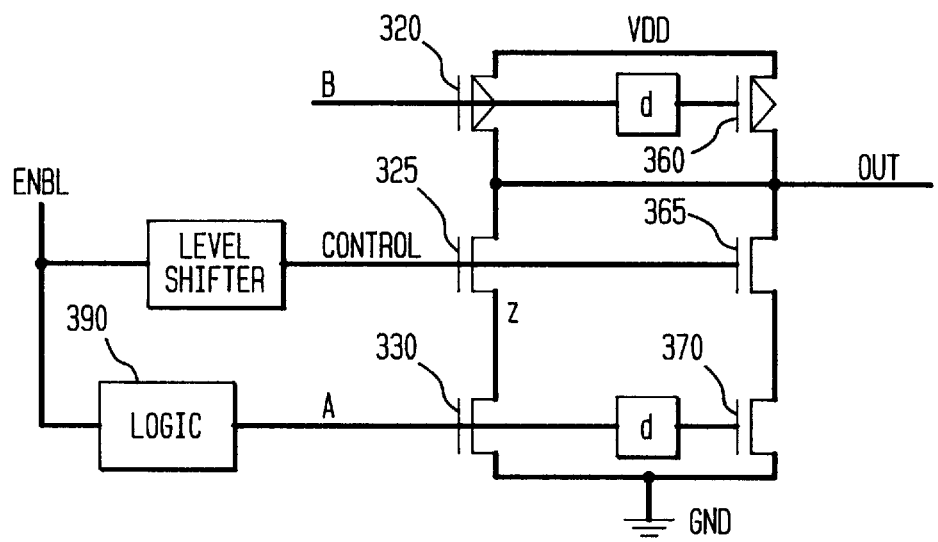
FIG. 3 shows an alternative embodiment of the invention.

FIG. 3 shows another embodiment of the invention. As shown, the OCD 301 is similar to that shown in FIG. 2. The OCD 301 advantageously employs an ENBL signal to gate the stacked transistors 325 and 365 as well as n-FETs 330 and 370. The ENBL signal is an external signal that controls a memory chip, such as a DRAM or SDRAM. The ENBL signal is the global signal for enabling and disabling the outputs of the memory chip when it is active and inactive, respectively.

Typically, the ENBL signal is fed into existing memory chip logic circuitry 390 along with other signals. The logic circuitry generates an output A, which controls transistor 330 and 370. By using the ENBL signal to gate the stacked transistors, the delay circuit 240 of FIG. 2 can advantageously be eliminated. This is because the logic circuitry 390 provides sufficient delay, allowing the stacked transistors to be switched on before data has to be driven, i.e., switching on of transistors 330 and 370. As such, the OCD performance is not adversely affected.

Figure 4:
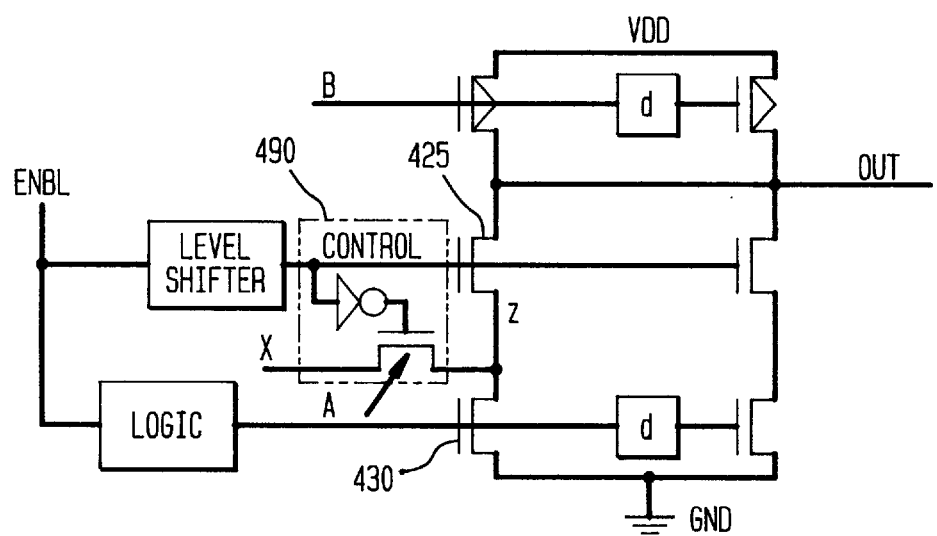
FIG. 4 shows yet another embodiment of the invention.

FIG. 4 shows yet another embodiment of an OCD 401, which is similar to OCD 301 of FIG. 3. As shown, a bleeder circuit 490 is provided. The bleeder circuit, when switched on, connects node z to a voltage level x. As such, the voltage at node z is equal to about $x-V_t$, where $V_t$ is the gate threshold of the stacked transistor when the stacked device and the protected n-FET are switched off. The voltage level x is sufficient to reduce the source-drain voltage in order to reduce or prevent hot carrier degradation. In one embodiment, x is equal to about 2.5V.

By selectively connecting node z to voltage x, the bleeder circuit provides additional protection from hot carrier degradation. For example, a situation where node z is undefined (i.e., when it is disconnected from $V_{DD}$ and GND) could occur when both the control signal C and signal A are low, switching off the stacked transistor 425 and n-FET 430. In this scenario, node z could equal to GND. As a result, n-FET 425 could experience the worst case source-drain voltage when it is switched on. The bleeder circuit ensures that node z remains at a voltage equal to about x–$V_t$. Thus, n-FET 425 is only exposed to a source-drain voltage of about $V_{DD}$–(x–$V_t$), which is not sufficient to cause hot carrier degradation.

In one embodiment, the bleeder circuit 490 comprises an inverter 492 whose input is coupled to the control signal. The inverter acts as a switch that activates or deactivates the bleeder circuit. The bleeder circuit is switched on when the stacked transistor is switched off and vise-versa. The output of inverter 495 is coupled to a gate of a transistor 495. The drain of the transistor 495 is coupled to node z and the source is coupled to voltage level x. When the bleeder circuit is switched on and transistor 430 is switched off, node z has a voltage equal to about x–$V_t$.

While the invention has been particularly shown and described with reference to various illustrative embodiments, it will be recognized by those skilled in the art that modifications and changes may be made to the present invention without departing from the spirit and scope thereof. Merely by way of example, any OCD design that employs stacking of transistors are useful. Such OCD design includes one based on more complex approaches (e.g., self clamping diode configuration) or single or multiple stages. The scope of the invention should therefore be determined not with reference to the above description but with reference to the appended claims along with their full scope of equivalents.

What is claimed is:

1. An off chip driver comprising:
   at least a first stage, wherein the first stage comprises first and second transistors having a first input coupled in series between the first transistor and a gate of the first transistor and a second input coupled to a gate of the second transistor; and
   a stacked transistor coupled to the second transistor to reduce the source-drain voltage of the second transistor during switching to reduce hot carrier degradation, the stacked transistor controlled by a control signal, wherein the control signal switches on the stacked transistor prior to the switching of the second transistor.

2. The off chip driver as recited in claim 1, wherein the control signal controls the stacked transistor and the second transistor.

3. The off chip driver as recited in claim 2, further comprises a delay circuit for delaying the control signal such that the control signal enables the stacked transistor before the second transistor.

4. The off chip driver as recited in claim 3, wherein the delay circuit includes two inverters coupled in series.

5. The off chip driver as recited in claim 3, wherein the delay circuit includes logic circuitry.

6. The off chip driver as recited in claim 1, wherein the control signal is provided by a level shifter for overdriving the stacked transistor and thereby reducing resistance thereof.

7. The off chip driver as recited in claim 6, further comprises a bleeder circuit coupled between the level shifter, the gate of the stacked transistor and a node between the stacked transistor and the second transistor for reducing a source-drain voltage of the stacked transistor.

8. The off chip driver as recited in claim 7, wherein the bleeder circuit further comprises:
   an inverter coupled between the gate of the stacked transistor and a gate of a bleeder transistor for switching the bleeder transistor on and off;
   the bleeder transistor having a predetermined voltage applied to a source thereof and having a drain coupled to the node such that the stacked transistor has a reduced source-drain voltage to prevent hot carrier degradation.

9. The off chip driver as recited in claim 1, wherein the second transistor and the stacked transistor are n-FETs and the first transistor is a p-FET.

10. An off chip driver for semiconductor memories comprising:
    a first stage wherein the first stage comprises first and second transistors having a first input coupled to a gate of the first transistor and a second input coupled to a gate of the second transistor;
    a first stage stacked transistor coupled to the second transistor during switching to reduce hot carrier degradation, the first stage stacked transistor and the second transistor controlled by a control signal, wherein the control signal switches on the first stage stacked transistor prior to the switching of the second transistor; and
    a second stage coupled in parallel with the first stage wherein the second stage further comprises:
        a third transistor and a fourth transistor having the first input coupled to a gate of the third transistor and the second input coupled to a gate of the fourth transistor;
        a second stage stacked transistor coupled to the fourth transistor to reduce hot carrier degradation, the second stage stacked transistor and the fourth transistor controlled by the control signal, wherein the control signal switches on the second stage stacked transistor prior to the switching of the fourth transistor;
        a first delay circuit electrically coupled between a gate of the first transistor and a gate of the third transistor; and
        a second delay circuit electrically coupled between a gate of the second transistor and a gate of the fourth transistor wherein the first and second delay circuits provide a delay for signals between the first stage and the second stage to reduce noise.

11. The off chip driver as recited in claim 10, further comprises a third delay circuit for delaying the control signal such that the control signal enables the stacked transistors before the second and fourth transistors.

12. The off chip driver as recited in claim 11, wherein the third delay circuit includes two inverters coupled in series.

13. The off chip driver as recited in claim 11, wherein the third delay circuit includes logic circuitry.

14. The off chip driver as recited in claim 10, wherein the control signal is provided by a level shifter for overdriving the first and second stage stacked transistors and thereby reducing resistance thereof.

15. The off chip driver as recited in claim 14, further comprises a bleeder circuit coupled between the level shifter, the gates of the first and second stage stacked transistors and a node between the first stage stacked transistor and the second transistor for reducing a source-drain voltage of the first stage stacked transistor.

16. The off chip driver as recited in claim 15, wherein the bleeder circuit further comprises:
    an inverter coupled between the gate of the first stage stacked transistor and a gate of a bleeder transistor for switching the bleeder transistor on and off;
    the bleeder transistor having a predetermined voltage applied to a source thereof and having a drain coupled to the node such that the first stage stacked transistor has a reduced source-drain voltage to prevent hot carrier degradation.

17. The off chip driver as recited in claim 10, wherein the second transistor, the fourth transistor, the first stage stacked transistor and the second stage stacked transistor are n-FETs and the first transistor and the third are p-FETs.

18. An off chip driver for an integrated memory device comprising:

at least a first stage, wherein the first stage comprises first and second transistors having a first input coupled to a gate of the first transistor and a second input coupled to a gate of the second transistor;

a stacked transistor coupled in series between the first transistor and the second transistor to reduce the source-drain voltage of the second transistor during switching to reduce hot carrier degradation; and means for controlling the stacked transistor and the second transistor whereby the stacked transistor is turned on prior to the second transistor.

19. The off chip driver as recited in claim 18, wherein the means for controlling includes a level shifter.

20. The off chip as recited in claim 19, wherein the means for controlling includes a delay circuit.

* * * * *